(12) United States Patent
Daghighi et al.

(10) Patent No.: US 8,375,341 B2
(45) Date of Patent: Feb. 12, 2013

(54) METHOD FOR IMPROVING THE RADIO FREQUENCY LINEARITY OF SILICON-ON-INSULATOR MOSFET CIRCUITS

(76) Inventors: Arash Daghighi, Isfahan (IR); Neda Pourdavoud Ganjabadi, Isfahan (IR)

( * ) Notice: Subject to any disclaimer, the term of this patent is extended or adjusted under 35 U.S.C. 154(b) by 0 days.

(21) Appl. No.: 13/470,292

(22) Filed: May 12, 2012

(65) Prior Publication Data

US 2012/0233579 A1 Sep. 13, 2012

(51) Int. Cl.
*G06F 17/50* (2006.01)
(52) U.S. Cl. ....................................................... 716/110
(58) Field of Classification Search .................... 716/110
See application file for complete search history.

(56) References Cited

U.S. PATENT DOCUMENTS

2012/0169398 A1* 7/2012 Brindle et al. ................ 327/434

* cited by examiner

*Primary Examiner* — Suchin Parihar

(57) ABSTRACT

A method for improving the radio frequency linearity of SOI MOSFET circuits is disclosed. In particular, a method for determining output conductance transition-free body resistances ("$R_{body}$") for SOI MOSFETs used in SOI MOSFET circuits to eliminate their output conductance transition in the radio frequency range is disclosed. The $R_{body}$ of the SOI MOSFETs can be adjusted by changing the number of fingers, i.e., gates, in an SOI MOSFET and/or varying other layout parameters, such as finger width. The transition-free SOI MOSFETs result in improved linearity of mixed-signal, radio-frequency, analog integrated circuits, where body-contacted SOI MOSFETs are preferred because a high degree of device matching is required.

18 Claims, 7 Drawing Sheets

METHOD FOR IMPROVING THE RADIO FREQUENCY LINEARITY OF SILICON-ON-INSULATOR MOSFET CIRCUITS

SPONSORSHIP STATEMENT

This application has been financially sponsored for international filing by the Iranian Nanotechnology Initiative Council and the Shahrekord University.

TECHNICAL FIELD

This application generally relates to a method for manufacturing integrated circuits, and more particularly relates to a method for improving the radio frequency linearity of silicon-on-insulator metal-oxide-semiconductor field-effect transistor circuits.

BACKGROUND

As metal-oxide-semiconductor field-effect transistors ("MOSFETs") in integrated circuits have become nanosized, i.e., having device dimensions of less than a 100 nm, silicon-on-insulator ("SOI") MOSFETs have been found to have improved functionality relative to Bulk MOSFETs. In particular, the improved transistor electrostatics of SOI MOSFETs result in comparatively low inter-device noise coupling and comparatively low substrate interference in radio frequency and mixed voltage circuits. As such, SOI MOSFETs have been adopted for system-on-chip ("SoC") applications that can require the integration of analog, digital, mixed-signal, and/or radio frequency circuits on a single chip.

Referring to FIG. 1, a three-dimensional view of an H-gate body-contacted partially-depleted SOI MOSFET is illustrated. The SOI MOSFET 100 can be nanosized and includes a substrate 102, a buried oxide layer 104 over the substrate 102, a source 106 and a drain 108 opposing one another, and a polysilicon gate 110 having gate spacers 112 and 114 between the source 106 and drain 108. Two oxide extensions 116 and 118 are located at opposite ends of the polysilicon gate 110 and two p$^+$ doped body contacts 120 and 122 are located at opposite ends of the SOI MOSFET 100.

Because of the buried oxide layer 104 located beneath the silicon device layer including the source 106, drain 108, polysilicon gate 110, oxide extensions 116 and 118, and p$^+$ doped body contacts 120 and 122, the performance characteristics of SOI MOSFETs are considerably different from Bulk MOSFETs. In particular, the movement of generated holes in the impact-ionization process under the polysilicon gate 110 towards the body contacts 120 and 122 creates a potential buildup in the body of SOI MOSFETs, leading to elevated body voltage. As such, SOI MOSFETs experience floating body effects and self-heating effects. To eliminate the floating body effects and the resulting variations in body potential, the bodies of SOI MOSFETs are typically connected to either the source in a body-tied-source structure or an independent body voltage through an external contact in a T-gate or H-gate configuration.

Referring to FIG. 2, a cross-section of an example H-gate body-contacted partially-depleted SOI MOSFET showing its body contacts is illustrated. In an H-gate body-contacted configuration, the p$^+$ doped body contacts 120 and 122 are connected to the body of the SOI MOSFET 100 under the polysilicon gate 110, as illustrated in FIG. 2, creating a path for generated holes to escape. For example, in the partially-depleted SOI MOSFET 200 of FIG. 2, the regions of the p$^+$ doped body contacts 120 and 122 each include two contacts 202.

The key MOSFET device characteristics for the design of mixed-signal, analog integrated circuits are the drain-source current, the gate transconductance, and the output conductance. Variations in the output conductance directly affect the intrinsic gain and degrade the transistor linearity of a device. The transition due to the finite body resistance occurs in the radio frequency range and affects the linear behavior of a device by, for example, increasing the total harmonic distortion and lowering the third-order intercept point of the device.

There is typically a transition in the output conductance of SOI MOSFETs due to their non-zero body resistance. Therefore, to improve the linearity of SOI MOSFET circuits, the transition due to finite body resistance should be eliminated. As such, a new method for designing SOI MOSFET circuits with improved linear characteristics is needed.

SUMMARY

A method for improving the radio frequency linearity of SOI MOSFET circuits is disclosed. Initially, a circuit design including one or more SOI MOSFETs, where each SOI MOSFET has a first body resistance, is received. Next, the received circuit including the one or more SOI MOSFETs with the first body resistances is simulated. The first biasing points of the received circuit are then determined based on the simulation of the received circuit including the one or more SOI MOSFETs with the first body resistances. A second body resistance for each of the one or more SOI MOSFETs in the received circuit is then calculated. Next, the received circuit including the one or more SOI MOSFETs with the second body resistances is simulated. The second biasing points of the received circuit are then determined based on the simulation of the received circuit including the one or more SOI MOSFETs with the second body resistances. An indication that the second biasing points are equal to the first biasing points is then received. Finally, in response to reception of the indication that the second biasing points are equal to the first biasing points, circuit parameters of the received circuit with the one or more SOI MOSFETs having transition-free body resistances is stored.

In some implementations, the received circuit including the one or more SOI MOSFETs with the first body resistances is simulated using a Simulation Program with Integrated Circuit Emphasis.

In some implementations, the second body resistance for each of the one or more SOI MOSFETs in the received circuit is computed according to the following equation:

$$R_{Body} = \frac{C_{BD}}{g_{BDS}(C_{BD} + C_{BG} + C_{BS}) + g_{BD}(C_{BG} + C_{BS}) - C_{BD} \cdot g_{BS}},$$

where $C_{BD}$ is the body-drain capacitance of an SOI MOSFET, $C_{BG}$ is the body-gate capacitance of the SOI MOSFET, $C_{BS}$ is the body-source capacitance of the SOI MOSFET, $G_{BDS}$ is the drain-source induced conductance due to impact ionization current flowing through the body of the SOI MOSFET, $G_{BD}$ is the body-drain conductance of the SOI MOSFET, and $G_{BS}$ is the body-source conductance of the SOI MOSFET.

In some implementations, the transition-free body resistance is stored for each of the one or more SOI MOSFETs in the received circuit. In some implementations, the number of fingers is stored for each of the one or more SOI MOSFETs in the received circuit.

In some implementations, an indication that the second biasing points are not equal to the first biasing points can be received. In response to reception of the indication that the second biasing points are not equal to the first biasing points, a third body resistance for each of the one or more SOI MOSFETs in the received circuit can then be calculated, the received circuit including the one or more SOI MOSFETs with the third body resistances can then be simulated, the third biasing points of the received circuit can then be calculated based on the simulation of the received circuit including the one or more SOI MOSFETs with the third body resistances, an indication that the third biasing points are equal to the second biasing points can then be received, and, finally, circuit parameters of the received circuit with the one or more SOI MOSFETs having transition-free body resistances can be stored in response to reception of the indication that the third biasing points are equal to the second biasing points.

The various aspects, implementations, and features of the method disclosed in this application may be implemented using, for example, one or more of an apparatus, a system, a processing device for performing a method, and/or a computer program or other set of instructions embodied in a tangible computer readable medium. The tangible computer readable medium may include, for example, instructions, software, images, and/or other data.

For example, in some implementations, a system comprising at least one processor connected to at least one computer-readable medium is configured to improve the radio frequency linearity of SOI MOSFET circuits. In particular, the at least one processor is configured to receive a circuit design including one or more SOI MOSFETs, where each SOI MOSFET has a first body resistance, simulate the received circuit including the one or more SOI MOSFETs with the first body resistances, determine first biasing points of the received circuit based on the simulation of the received circuit including the one or more SOI MOSFETs with the first body resistances, compute a second body resistance for each of the one or more SOI MOSFETs in the received circuit, simulate the received circuit including the one or more SOI MOSFETs with the second body resistances, determine second biasing points of the received circuit based on the simulation of the received circuit including the one or more SOI MOSFETs with the second body resistances, receive an indication that the second biasing points are equal to the first biasing points, and store circuit parameters of the received circuit with the one or more SOI MOSFETs having transition-free body resistances in response to reception of the indication that the second biasing points are equal to the first biasing points.

In another example, a tangible computer-readable medium has embodied thereon a computer program for improving the radio frequency linearity of SOI MOSFET circuits. In particular, the computer program includes one or more code segments that, when executed, cause at least one processor to receive a circuit design including one or more SOI MOSFETs, where each SOI MOSFET has a first body resistance, simulate the received circuit including the one or more SOI MOSFETs with the first body resistances, determine first biasing points of the received circuit based on the simulation of the received circuit including the one or more SOI MOSFETs with the first body resistances, compute a second body resistance for each of the one or more SOI MOSFETs in the received circuit, simulate the received circuit including the one or more SOI MOSFETs with the second body resistances, determine second biasing points of the received circuit based on the simulation of the received circuit including the one or more SOI MOSFETs with the second body resistances, receive an indication that the second biasing points are equal to the first biasing points, and store circuit parameters of the received circuit with the one or more SOI MOSFETs having transition-free body resistances in response to reception of the indication that the second biasing points are equal to the first biasing points.

Details of one or more implementations and/or embodiments of the method for improving the radio frequency linearity of SOI MOSFET circuits are set forth in the accompanying drawings and the description below. Other aspects that can be implemented will be apparent from the description and drawings, and from the claims.

BRIEF DESCRIPTION OF DRAWINGS

Like reference symbols indicate like elements throughout the specification and drawings.

DETAILED DESCRIPTION

A method for improving the radio frequency linearity of SOI MOSFET circuits is disclosed. In particular, a method for determining output conductance transition-free body resistances ("$R_{body}$") for SOI MOSFETs used in SOI MOSFET circuits to eliminate their output conductance transition in the radio frequency range is disclosed. The $R_{body}$ of the SOI MOSFETs can be adjusted by changing the number of fingers, i.e., gates, in an SOI MOSFET and/or varying other layout parameters, such as finger width. The transition-free SOI MOSFETs result in improved linearity of mixed-signal, radio-frequency, analog integrated circuits, where body-contacted SOI MOSFETs are preferred because a high degree of device matching is required.

Figure 1:
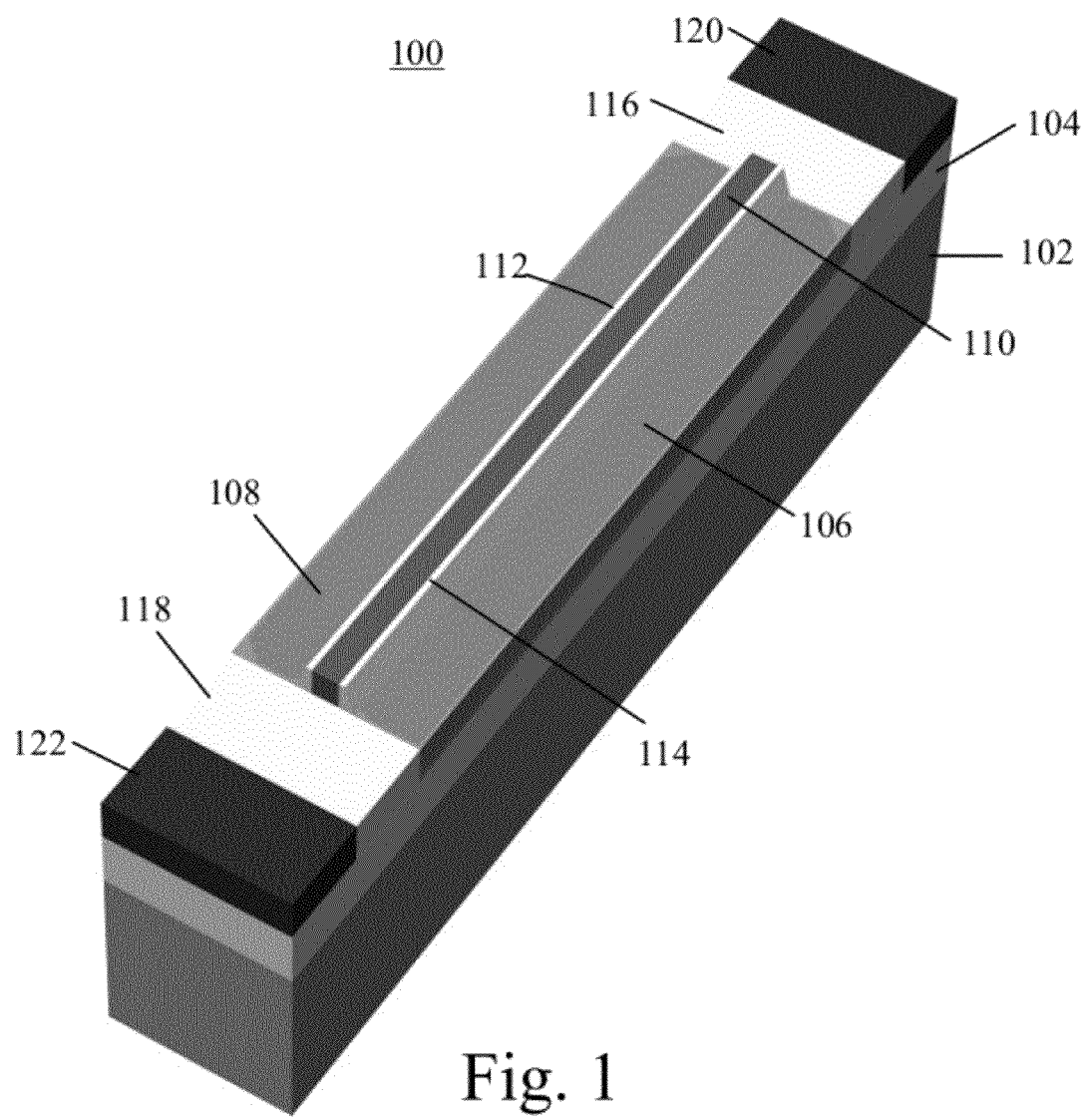
FIG. 1 illustrates a three-dimensional view of an example H-gate body-contacted partially-depleted SOI MOSFET.
Figure 2:
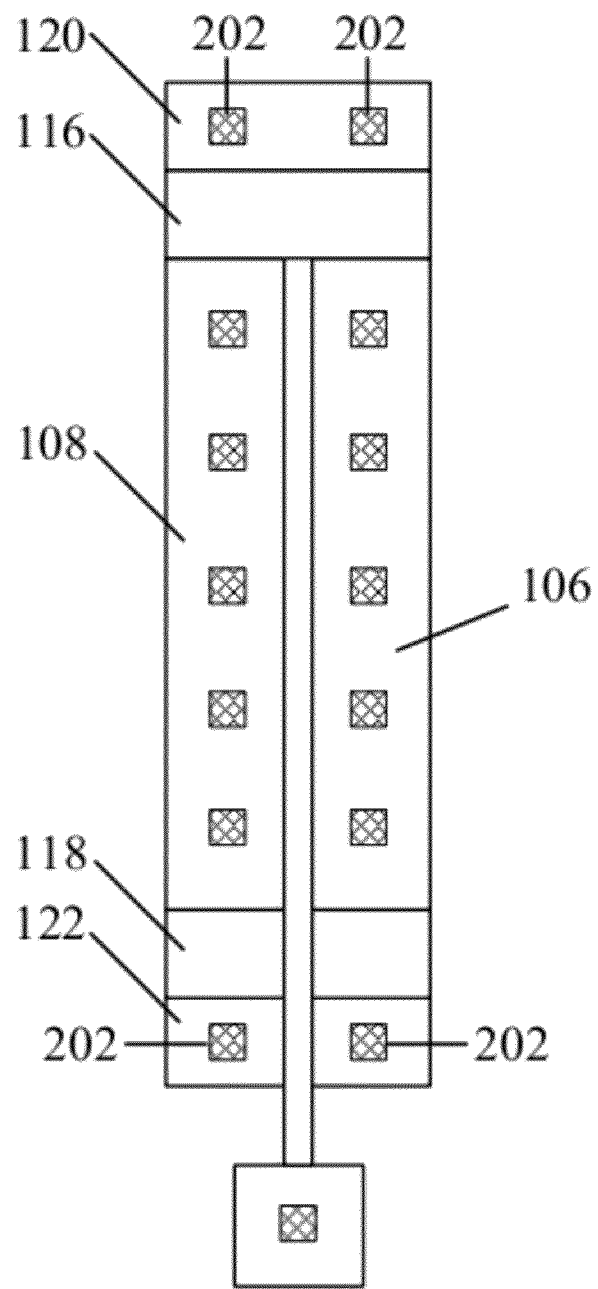
FIG. 2 illustrates a cross-section of an example H-gate body-contacted partially-depleted SOI MOSFET showing its body contacts.
Figure 3:
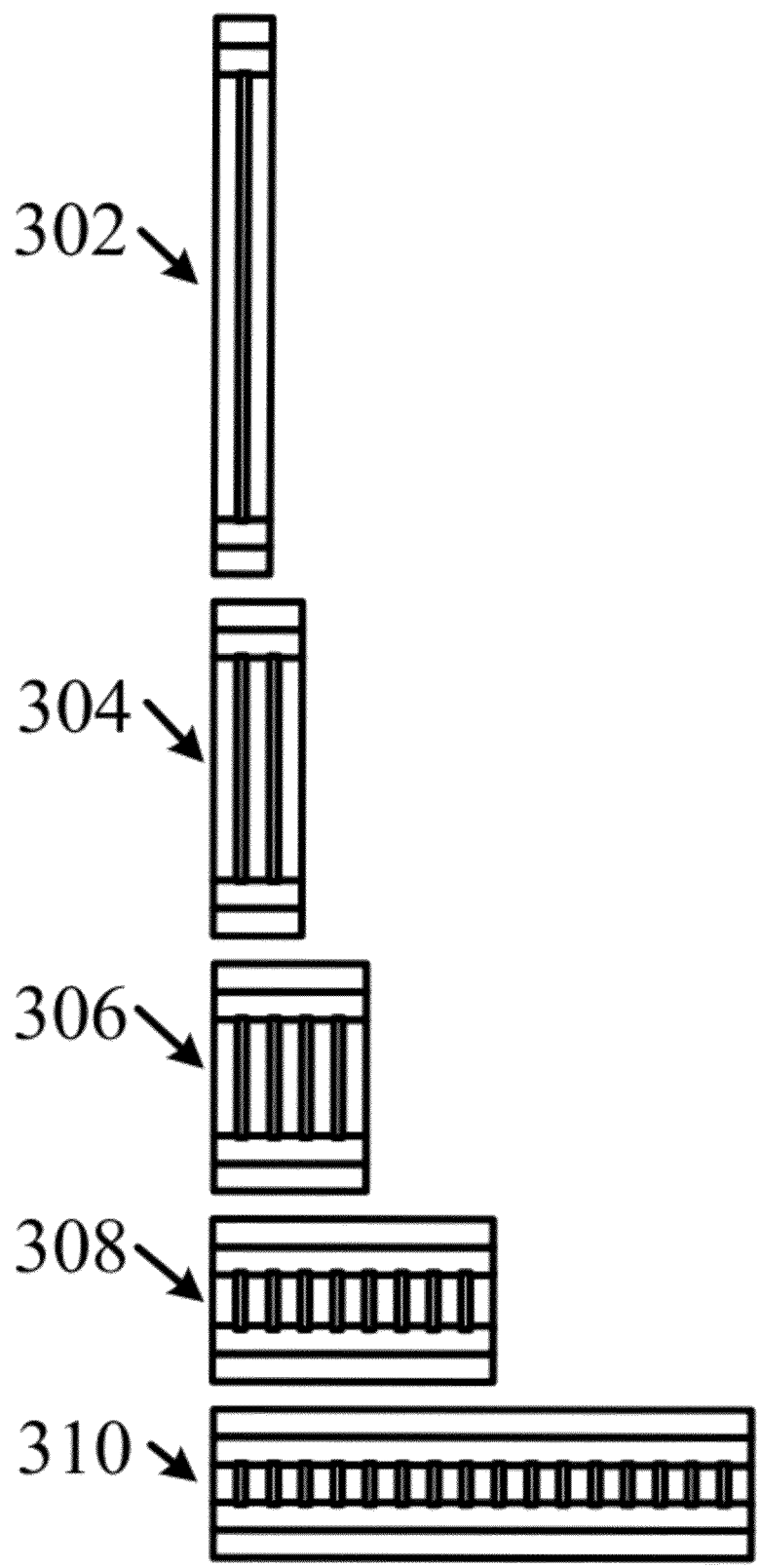
FIG. 3 illustrates cross-sectional views of different layouts of body-contacted SOI MOSFETs.

Referring to FIG. 3, cross-sectional views of different layouts of body-contacted SOI MOSFETs that can be used for high frequency, such as radio frequencies ranging from, for example, 500 MHz to 10 GHz, applications are illustrated. Although radio frequencies have been disclosed, SOI MOSFETs working in other frequency ranges can also benefit from the method disclosed in this application.

As shown in FIG. 3, layout 302 includes a single gate, i.e., finger, layout 304 includes two gates, layout 306 includes four gates, layout 308 includes eight gates, and layout 310 includes 16 gates. Because each layout of an SOI MOSFET includes a different number of gates which can be electrically connected, the $R_{body}$ of each SOI MOSFET in layouts 302-310 differs, while each layout has the same effective device width and an equal drive current ignoring the edge effects. In particular, the effective device width of each layout 302-310, defined as the distance between the two $p^+$ doped body contacts 120 and 122 minus the two oxide extension 116 and 118 widths multiplied by the number of gates in the particular layout, is the same. The finger width is defined as the distance between the two $p^+$ doped body contacts 120 and 122 minus the two oxide extension 116 and 118 widths. As such, layout 304 has half the device width as layout 302, but includes two gates and, therefore, has the same effective device width.

Specifically, the $R_{body}$ of layout 302 is greater than the $R_{body}$ of layout 304. Similarly, the $R_{body}$ of layout 304 is greater than the $R_{body}$ of layout 306, $R_{body}$ of layout 306 is greater than the $R_{body}$ of layout 308, and the $R_{body}$ of layout 308 is greater than the $R_{body}$ of layout 310. As such, because the $R_{body}$ of an SOI MOSFET is dependent on the selected layout of the SOI MOSFET and the RF linearity of a mixed-signal, analog integrated circuit is dependent on the $R_{body}$ of the one or more SOI MOSFETs of the circuit, the RF linearity of a mixed-signal, analog integrated circuit is dependent on the selected SOI MOSFET layout.

Figure 4:
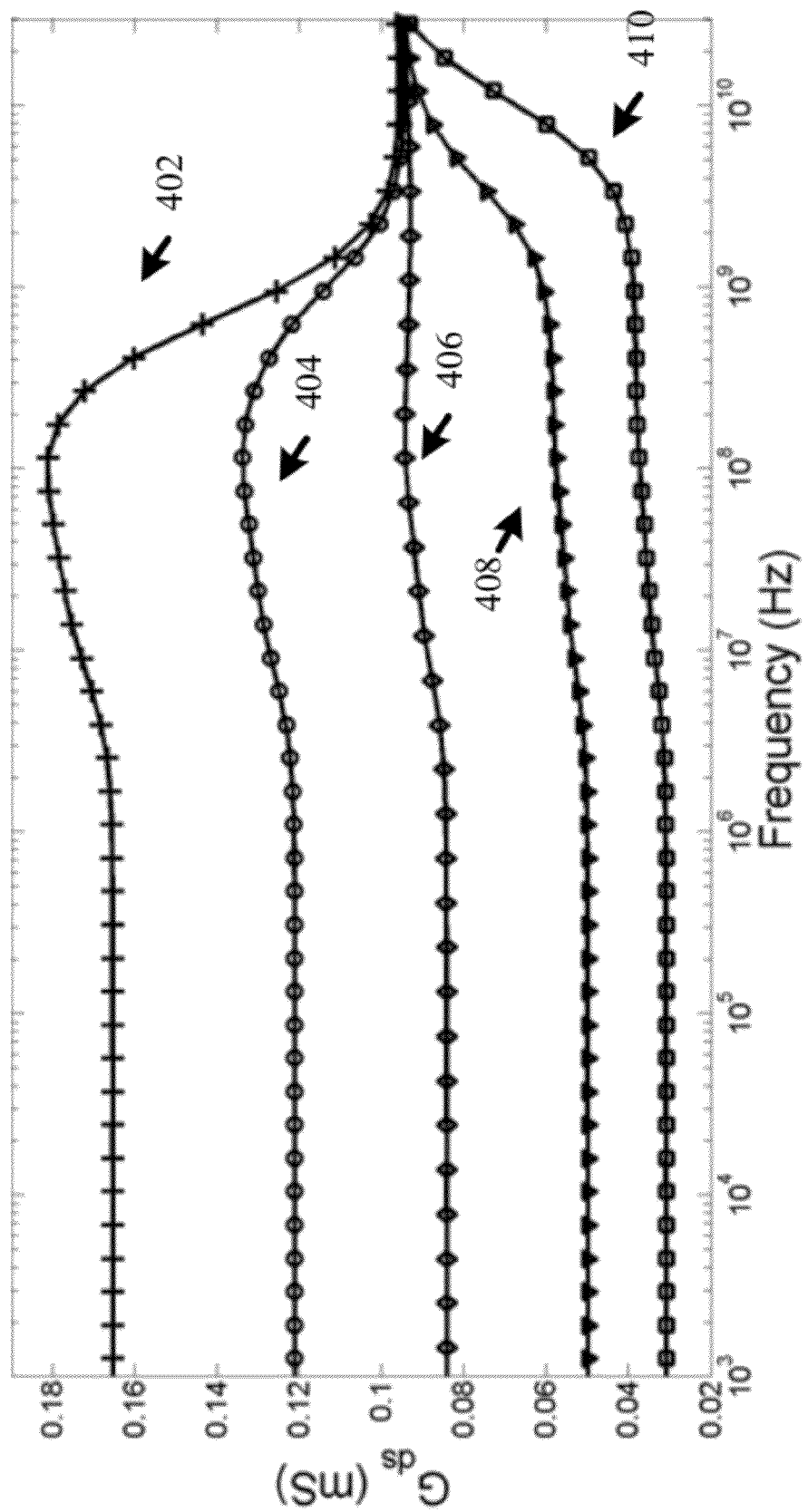
FIG. 4 illustrates the output conductances of the different layouts of the body-contacted SOI MOSFETs as a function of frequency.

Referring to FIG. 4, the output conductances of body-contacted SOI MOSFETs with the layouts 302-310 as a function of frequency are illustrated. The conductance is measured in millisiemens and the tested frequencies range from 1 MHz to 10 GHz. The SOI MOSFETs are 45 nm MOSFETs having a gate voltage of 1.1 volts. Output conductance line 402 corresponds to layout 302 of FIG. 3, conductance line 404 corresponds to layout 304, conductance line 406 corresponds to layout 306, conductance line 408 corresponds to layout 308, and conductance line 410 corresponds to layout 310. Layouts 302 and 304 exhibit output conductances increasing at about $10^6$ Hz due to self-heating effects and then decreasing at about $10^8$ Hz due to body resistance effects. Layout 308 and 310 exhibit output conductances increasing at about $10^6$ Hz due to self-heating effects. However, as shown by the substantially consistent, transition-free output conductance line 406 of layout 306, the output conductance transition due to non-zero $R_{body}$ is eliminated because the pole and zero in the drain-source conductance relation cancels out.

Figure 5:
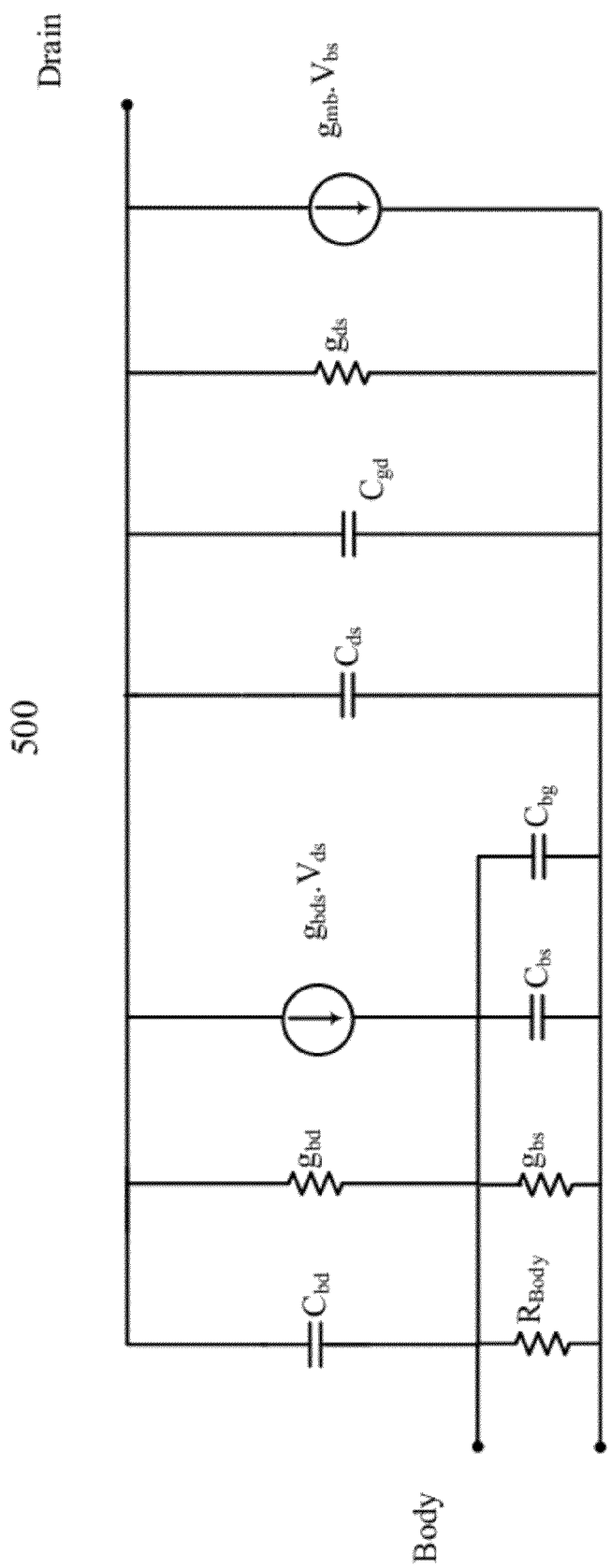
FIG. 5 illustrates a small-signal circuit model of an SOI MOSFET with the source and gate terminals tied together.

Referring to FIG. 5, a small-signal circuit model 500 of an SOI MOSFET with the source and gate terminals tied together is illustrated. The circuit is divided into low frequency and high frequency sub-circuits. The $C_{BD}$ is the body-drain capacitance, the $C_{BS}$ is the body-source capacitance, the $C_{BG}$ is the body-gate capacitance, the $C_{DS}$ is the drain-source capacitance, the $C_{GD}$ is the gate-drain capacitance, the $G_{BD}$ is the drain junction conductance, the $G_{BS}$ is the body-source junction conductance, the $G_{DS}$ is the drain-source conductance, the $G_{BD}$ is the body-drain conductance, the $G_{BDS}$ is the drain-source induced conductance resulting from impact ionization current flowing through the body, and the $G_{MB}$ is the small-signal current induced from body voltage fluctuations into the device model.

Based on the small-signal circuit model 500, the output conductance of a body-contacted SOI MOSFET is characterized by a zero and a pole that, in turn, are a variable of the $R_{body}$. If the $R_{body}$ is relatively small, the pole is located at a higher frequency and the transition in output conductance is increasing. As the $R_{body}$ increases, the zero-pole doublet is shifted to lower frequencies. If the $R_{body}$ is relatively large, the zero is located at a higher frequency and the transition in output conductance is decreasing. Therefore, to eliminate the output conductance transition, the body-contacted SOI MOSFET should be designed such that both the pole frequency and the zero frequency are almost equal, i.e., within about 1% of the same frequency. In other words, by equating the body node voltage in the low frequency to high frequency range, the transition in the output conductance due to the nonzero $R_{body}$ can be eliminated. The $R_{body}$ of an SOI MOSFET based in the small-signal circuit model 500 can be computed by EQ. 1, below.

$$R_{Body} = \frac{C_{BD}}{g_{BDS}(C_{BD} + C_{BG} + C_{BS}) + g_{BD}(C_{BG} + C_{BS}) - C_{BD} \cdot g_{BS}} \quad (1)$$

EQ. 1 can be used in the method 600, described with reference to FIG. 6, to determine the $R_{body}$ of a circuit based on circuit characteristics acquired during simulation.

Figure 6:
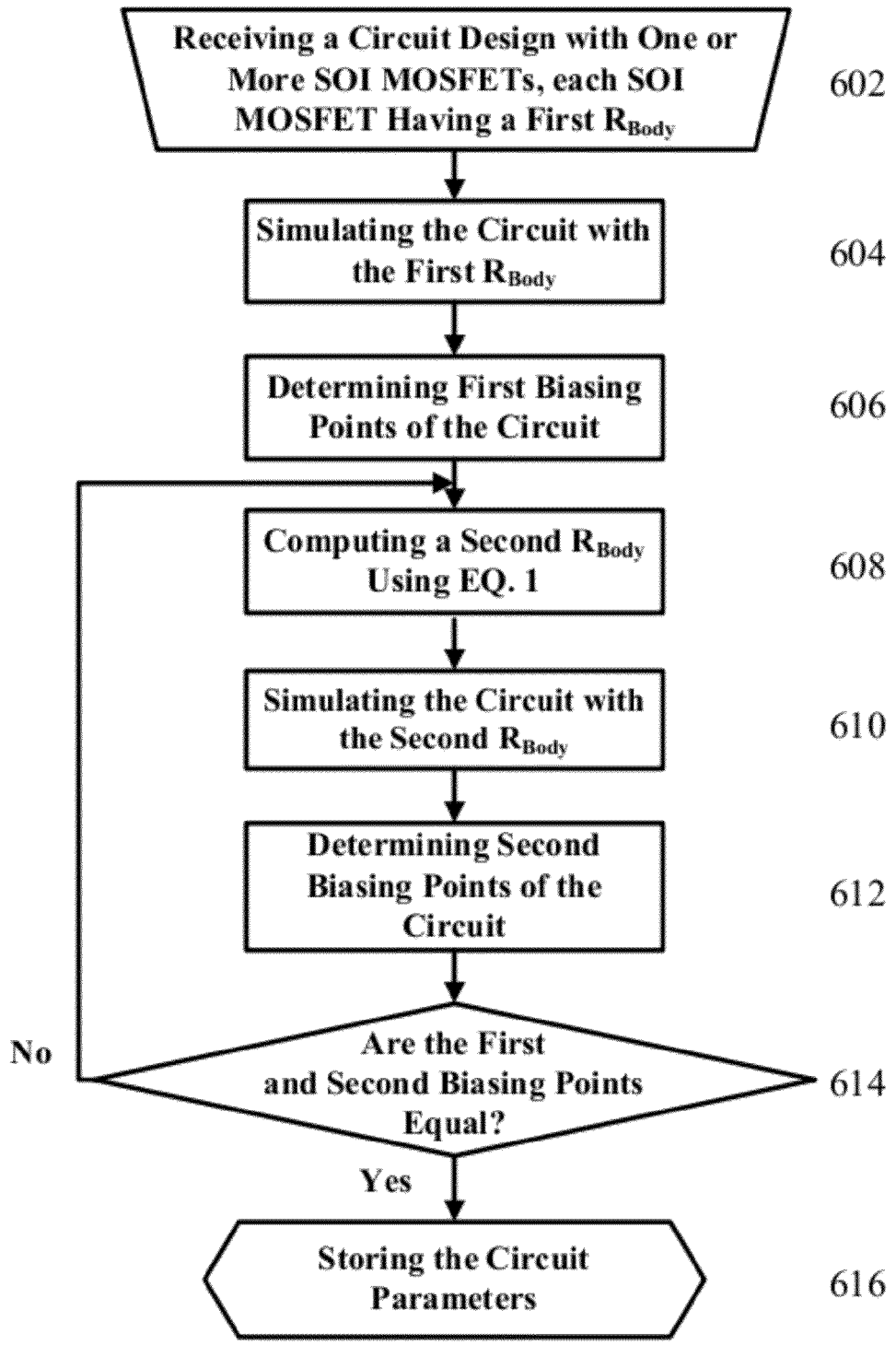
FIG. 6 illustrates an example of a method for determining and storing circuit layout parameters for SOI MOSFET circuits to improve their radio frequency linearity.

Referring to FIG. 6, an example of a method 600 for determining and storing circuit layout parameters for SOI MOSFET circuits to improve their radio frequency linearity is illustrated. The SOI MOSFET circuits can be, for example, mixed-signal, analog integrated circuits and, preferably, mixed-signal, radio frequency, analog integrated circuits. Initially, a circuit design including one or more SOI MOSFETs, where each SOI MOSFET has a respective first $R_{body}$, is received (step 602).

The received circuit design is then simulated with the one or more SOI MOSFETs having the respective first $R_{body}$ (step 604). The circuit design may be simulated by a Simulation Program with Integrated Circuit Emphasis ("SPICE"), or another circuit simulation program. Following simulation, the first biasing points of the SOI MOSFET circuit can be determined (step 606). The first biasing points, i.e., the quiescent points or Q-points, are the steady-state operating condition of the SOI MOSFET circuit having the one or more SOI MOSFETs with the respective first $R_{body}$. The first biasing points can be determined according to the circuit simulation in step 604 according to any well-known method. The first biasing points are then stored in a computer storage medium.

Next, a second $R_{body}$ for each of the one or more SOI MOSFETs is calculated using EQ. 1 (step 608). The values for the variables of EQ. 1 are obtained from the simulation of the received circuit design in step 604. The received circuit design is then again simulated with the second $R_{body}$ (step 610). The circuit design with the second $R_{body}$ can be simulated using the same program as used in step 604. Following the second simulation, the second biasing points of the SOI MOSFET circuit are determined (step 612). The second biasing points are then stored in a computer storage medium.

Next, the first biasing points and the second biasing points are compared to determine whether they are equal (step 614). If the first biasing points and the second biasing points are equal, then it is determined that the second $R_{body}$ of each of the SOI MOSFETs in the SOI MOSFET circuit is a transition-free $R_{body}$ that results in an output conductance transition-free SOI MOSFET, which in turn results in improved radio frequency linearity of the SOI MOSFET circuit. The circuit parameters are finally stored (step 616). The circuit parameters that are stored include, for example, the transition-free $R_{body}$ of each SOI MOSFET in the circuit, the device width of each SOI MOSFET in the circuit, the device length of each SOI MOSFET, the multiplication factor of each SOI MOSFET, the design values of any passive components of the SOI MOSFET circuit such as resistors, capacitors, and inductors, and/or the design values of any active components of the SOI MOSFET circuit such as diodes and varactors. In some implementations, only the transition-free $R_{body}$ of each SOI MOSFET in the circuit is stored as the circuit parameters. The circuit parameters can be stored in a computer storage medium.

If the first biasing points and the second biasing points are not equal, then the updated circuit parameters are used to iteratively calculate a subsequent $R_{body}$ for each of the one or more SOI MOSFETs in step 608. In particular, once the $R_{body}$ of at least one of the SOI MOSFETS in the received circuit is changed to its second $R_{body}$, the biasing points of that SOI MOSFET change, which may affect the biasing points of any other SOI MOSFETS in the circuit. As a result, the $R_{body}$ of each of the SOI MOSFETS in the circuit must be recalculated using EQ. 1. Steps 608, 610, 612, and 614 are then repeated as many times as necessary until the first biasing points and the second biasing points are equal. As a result, output conductance transition-free SOI MOSFETs and, in turn, an SOI MOSFET circuit with improved radio frequency linearity are obtained.

Figure 7:
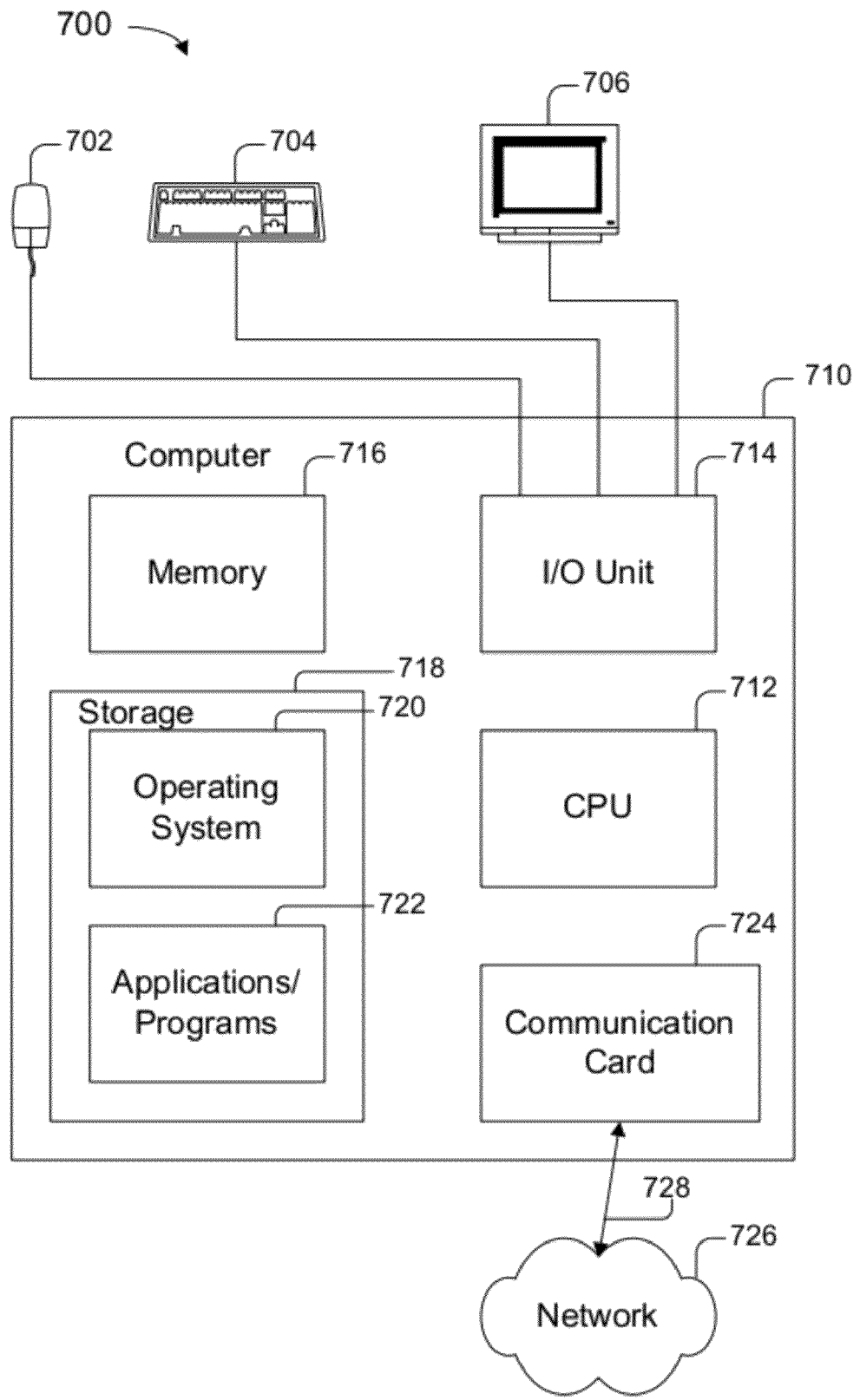
FIG. 7 illustrates a system that may be used to determine and store circuit layout parameters for SOI MOSFET circuits to improve their radio frequency linearity.

Referring to FIG. 7, a system 700 that may be used to implement method 600 to determine and store circuit layout parameters for SOI MOSFET circuits to improve their radio frequency linearity is illustrated. The hardware setup may include various input/output (I/O) devices (e.g., mouse 702, keyboard 704, and display 706) and a computer 710 having a central processor unit ("CPU") 712, an I/O unit 714, memory 716, and storage 718 that stores data and various applications such as an operating system 720 and one or more applications and/programs 722. The CPU 712 can be configured to receive and execute code segments from one or more computer programs. The memory 716 and/or storage 718 is/are tangible computer-readable medium(s) that are volatile or non-volatile. The tangible computer-readable medium(s) can be configured to embody and/or store computer programs. The computer program can include one or more code segments that cause at least the CPU 712 to execute various functions. The storage device 718 can, for example, include a hard disk device, an optical disk device, or some other large capacity storage device.

The computer 710 also includes a communications card or device 724 (e.g., a modem or a network adapter) for exchanging data with a network 726 via a communications link 728 (e.g., a telephone line, a wireless network link, a cable network). Other examples of system 700 include a workstation, a server, a device, a component, other equipment of some combination thereof capable of responding to and executing instructions in a defined manner. The CPU 712 can be, for example, a general or special purpose microprocessor is a single-threaded or multi-threaded. Generally, the CPU 712 will receive instructions and data, i.e., code segments of a computer program, from a memory, such as the memory 716.

Method 600 for creating an output conductance transition-free circuit design was used to design a 2.4 GHz cascode low noise amplifier. An output conductance transition-free cascode low noise amplifier having SOI MOSFETs with the calculated transition-free $R_{body}$ determined using method 600 had a 9 dB and a 4.5 dBm improvement in total harmonic distortion ("THD") and output third-order intercept point ("OIP3"), respectively, in comparison with the initial, received cascode low noise amplifier.

In some implementations, the system can automatically and/or a user can manually select an appropriate SOI MOSFET layout for each SOI MOSFET in the received circuit based on the transition-free $R_{body}$ and/or device width stored in step 616.

It is to be understood that the disclosed implementations are not limited to the particular processes, devices, and/or apparatus described which may, of course, vary. It is also to be understood that the terminology used herein is for the purpose of describing particular embodiments only, and is not intended to be limiting. As used in this application, the singular forms "a," "an," and "the" include plural referents unless the content clearly indicates otherwise.

Reference in the specification to "one implementation" or "an implementation" means that a particular feature, structure, characteristic, or function described in connection with the implementation is included in at least one implementation herein. The appearances of the phrase "in some implementations" in the specification do not necessarily all refer to the same implementation.

Accordingly, other embodiments and/or implementations are within the scope of this application.

What is claimed is:

1. A method for improving the radio frequency linearity of silicon-on-insulator ("SOI") metal-oxide-semiconductor field-effect transistor ("MOSFET") circuits, comprising:
receiving a circuit design including one or more SOI MOSFETs, each SOI MOSFET having a first body resistance;
simulating the received circuit including the one or more SOI MOSFETs with the first body resistances;
determining first biasing points of the received circuit based on the simulation of the received circuit including the one or more SOI MOSFETs with the first body resistances;
computing a second body resistance for each of the one or more SOI MOSFETs in the received circuit;
simulating the received circuit including the one or more SOI MOSFETs with the second body resistances;
determining second biasing points of the received circuit based on the simulation of the received circuit including the one or more SOI MOSFETs with the second body resistances;
receiving an indication that the second biasing points are equal to the first biasing points; and
in response to reception of the indication that the second biasing points are equal to the first biasing points, storing circuit parameters of the received circuit with the one or more SOI MOSFETs having transition-free body resistances.

2. The method of claim 1, wherein simulating the received circuit including the one or more SOI MOSFETs with the first body resistances comprises simulating the received circuit including the one or more SOI MOSFETs with the first body resistances using a Simulation Program with Integrated Circuit Emphasis.

3. The method of claim 1, wherein computing the second body resistance for each of the one or more SOI MOSFETs in the received circuit comprises computing the second body resistance for each of the one or more SOI MOSFETs in the received circuit according to the following equation:

$$R_{Body} = \frac{C_{BD}}{g_{BDS}(C_{BD} + C_{BG} + C_{BS}) + g_{BD}(C_{BG} + C_{BS}) - C_{BD} \cdot g_{BS}},$$

wherein
$C_{BD}$ is the body-drain capacitance of an SOI MOSFET,
$C_{BG}$ is the body-gate capacitance of the SOI MOSFET,
$C_{BS}$ is the body-source capacitance of the SOI MOSFET,
$G_{BDS}$ is the drain-source induced conductance due to impact ionization current flowing through the body of the SOI MOSFET,
$G_{BD}$ is the body-drain conductance of the SOI MOSFET, and $G_{BS}$ is the body-source conductance of the SOI MOSFET.

4. The method of claim 1, wherein storing the circuit parameters of the received circuit with the one or more SOI MOSFETs having transition-free body resistances comprises storing the transition-free body resistance for each of the one or more SOI MOSFETs in the received circuit.

5. The method of claim 1, wherein storing the circuit parameters of the received circuit with the one or more SOI MOSFETs having transition-free body resistances comprises storing the number of fingers for each of the one or more SOI MOSFETs in the received circuit.

6. The method of claim 1, further comprising:
receiving an indication that the second biasing points are not equal to the first biasing points; and
in response to reception of the indication that the second biasing points are not equal to the first biasing points:
computing a third body resistance for each of the one or more SOI MOSFETs in the received circuit,
simulating the received circuit including the one or more SOI MOSFETs with the third body resistances,
determining third biasing points of the received circuit based on the simulation of the received circuit including the one or more SOI MOSFETs with the third body resistances,
receiving an indication that the third biasing points are equal to the second biasing points, and
in response to reception of the indication that the third biasing points are equal to the second biasing points, storing circuit parameters of the received circuit with the one or more SOI MOSFETs having transition-free body resistances.

7. A system comprising at least one processor connected to at least one computer-readable medium, wherein the at least one processor is configured to:
receive a circuit design including one or more SOI MOSFETs, each SOI MOSFET having a first body resistance;
simulate the received circuit including the one or more SOI MOSFETs with the first body resistances;
determine first biasing points of the received circuit based on the simulation of the received circuit including the one or more SOI MOSFETs with the first body resistances;
compute a second body resistance for each of the one or more SOI MOSFETs in the received circuit;
simulate the received circuit including the one or more SOI MOSFETs with the second body resistances;
determine second biasing points of the received circuit based on the simulation of the received circuit including the one or more SOI MOSFETs with the second body resistances;
receive an indication that the second biasing points are equal to the first biasing points; and
in response to reception of the indication that the second biasing points are equal to the first biasing points, store circuit parameters of the received circuit with the one or more SOI MOSFETs having transition-free body resistances.

8. The system of claim 7, wherein the at least one processor is configured to simulate the received circuit including the one or more SOI MOSFETs with the first body resistances by simulating the received circuit including the one or more SOI MOSFETs with the first body resistances using a Simulation Program with Integrated Circuit Emphasis.

9. The system of claim 7, wherein at least one processor is configured to compute the second body resistance for each of the one or more SOI MOSFETs in the received circuit by computing the second body resistance for each of the one or more SOI MOSFETs in the received circuit according to the following equation:

$$R_{Body} = \frac{C_{BD}}{g_{BDS}(C_{BD} + C_{BG} + C_{BS}) + g_{BD}(C_{BG} + C_{BS}) - C_{BD} \cdot g_{BS}},$$

wherein
$C_{BD}$ is the body-drain capacitance of an SOI MOSFET,
$C_{BG}$ is the body-gate capacitance of the SOI MOSFET,
$C_{BS}$ is the body-source capacitance of the SOI MOSFET,
$G_{BDS}$ is the drain-source induced conductance due to impact ionization current flowing through the body of the SOI MOSFET,
$G_{BD}$ is the body-drain conductance of the SOI MOSFET, and
$G_{BS}$ is the body-source conductance of the SOI MOSFET.

10. The system of claim 7, wherein at least one processor is configured to store the circuit parameters of the received circuit with the one or more SOI MOSFETs having transition-free body resistances by storing the transition-free body resistance for each of the one or more SOI MOSFETs in the received circuit.

11. The system of claim 7, wherein the at least one processor is configured to store the circuit parameters of the received circuit with the one or more SOI MOSFETs having transition-free body resistances by storing the number of fingers for each of the one or more SOI MOSFETs in the received circuit.

12. The system of claim 7, wherein at least one processor is further configured to:
receive an indication that the second biasing points are not equal to the first biasing points; and
in response to reception of the indication that the second biasing points are not equal to the first biasing points:
compute a third body resistance for each of the one or more SOI MOSFETs in the received circuit,
simulate the received circuit including the one or more SOI MOSFETs with the third body resistances,
determine third biasing points of the received circuit based on the simulation of the received circuit including the one or more SOI MOSFETs with the third body resistances,
receive an indication that the third biasing points are equal to the second biasing points, and
in response to reception of the indication that the third biasing points are equal to the second biasing points, store circuit parameters of the received circuit with the one or more SOI MOSFETs having transition-free body resistances.

13. A tangible computer-readable medium having embodied thereon a computer program for improving the radio frequency linearity of silicon-on-insulator ("SOI") metal-oxide-semiconductor field-effect transistor ("MOSFET") circuits, the computer program comprising one or more code segments that, when executed, cause at least one processor to:
receive a circuit design including one or more SOI MOSFETs, each SOI MOSFET having a first body resistance;
simulate the received circuit including the one or more SOI MOSFETs with the first body resistances;
determine first biasing points of the received circuit based on the simulation of the received circuit including the one or more SOI MOSFETs with the first body resistances;

compute a second body resistance for each of the one or more SOI MOSFETs in the received circuit;

simulate the received circuit including the one or more SOI MOSFETs with the second body resistances;

determine second biasing points of the received circuit based on the simulation of the received circuit including the one or more SOI MOSFETs with the second body resistances;

receive an indication that the second biasing points are equal to the first biasing points; and in response to reception of the indication that the second biasing points are equal to the first biasing points, store circuit parameters of the received circuit with the one or more SOI MOSFETs having transition-free body resistances.

14. The tangible computer-readable medium of claim 13, wherein the one or more code segments that, when executed, cause at least one processor to simulate the received circuit including the one or more SOI MOSFETs with the first body resistances comprise one or more code segments that, when executed, cause the at least one processor to simulate the received circuit including the one or more SOI MOSFETs with the first body resistances using a Simulation Program with Integrated Circuit Emphasis.

15. The tangible computer-readable medium of claim 13, wherein the one or more code segments that, when executed, cause the at least one processor to compute the second body resistance for each of the one or more SOI MOSFETs in the received circuit comprise one or more code segments that, when executed, cause the at least one processor to compute the second body resistance for each of the one or more SOI MOSFETs in the received circuit according to the following equation:

$$R_{Body} = \frac{C_{BD}}{g_{BDS}(C_{BD} + C_{BG} + C_{BS}) + g_{BD}(C_{BG} + C_{BS}) - C_{BD} \cdot g_{BS}},$$

wherein
$C_{BD}$ is the body-drain capacitance of an SOI MOSFET,
$C_{BG}$ is the body-gate capacitance of the SOI MOSFET,
$C_{BS}$ is the body-source capacitance of the SOI MOSFET,
$G_{BDS}$ is the drain-source induced conductance due to impact ionization current flowing through the body of the SOI MOSFET,
$G_{BD}$ is the body-drain conductance of the SOI MOSFET, and
$G_{BS}$ is the body-source conductance of the SOI MOSFET.

16. The tangible computer-readable medium of claim 13, wherein the one or more code segments that, when executed, cause at least one processor to store the circuit parameters of the received circuit with the one or more SOI MOSFETs having transition-free body resistances comprise one or more code segments that, when executed, cause the at least one processor to store the transition-free body resistance for each of the one or more SOI MOSFETs in the received circuit.

17. The tangible computer-readable medium of claim 13, wherein the one or more code segments that, when executed, cause at least one processor to store the circuit parameters of the received circuit with the one or more SOI MOSFETs having transition-free body resistances comprise one or more code segments that, when executed, cause the at least one processor to store the number of fingers for each of the one or more SOI MOSFETs in the received circuit.

18. The tangible computer-readable medium of claim 13, wherein the computer program further comprises one or more code segments that, when executed, cause at least one processor to:

receive an indication that the second biasing points are not equal to the first biasing points; and in response to reception of the indication that the second biasing points are not equal to the first biasing points:
compute a third body resistance for each of the one or more SOI MOSFETs in the received circuit,
simulate the received circuit including the one or more SOI MOSFETs with the third body resistances,
determine third biasing points of the received circuit based on the simulation of the received circuit including the one or more SOI MOSFETs with the third body resistances,
receive an indication that the third biasing points are equal to the second biasing points, and
in response to reception of the indication that the third biasing points are equal to the second biasing points, store circuit parameters of the received circuit with the one or more SOI MOSFETs having transition-free body resistances.

* * * * *